United States Patent [19]

Stanton et al.

[11] Patent Number: 5,592,295
[45] Date of Patent: Jan. 7, 1997

[54] APPARATUS AND METHOD FOR SEMICONDUCTOR WAFER EDGE INSPECTION

[75] Inventors: Leslie G. Stanton, Simpsonville; Kenneth Krause, Clemson University, both of S.C.

[73] Assignee: MEMC Electronic Materials, Inc., St. Peters, Mo.

[21] Appl. No.: 436,840

[22] Filed: May 8, 1995

[51] Int. Cl.⁶ .......................... G01N 21/84; G01N 21/00; G01N 21/55

[52] U.S. Cl. .................. 356/426; 356/237; 356/445; 356/244; 250/559.4

[58] Field of Search .................... 250/559.4, 559.42, 250/559.14; 356/426, 237, 240, 445–446, 244

[56] References Cited

U.S. PATENT DOCUMENTS

| | | | |
|---|---|---|---|
| 4,954,721 | 9/1990 | Suzuki | 250/559.4 |
| 5,003,188 | 3/1991 | Igari | 250/559.4 |
| 5,504,345 | 4/1996 | Bartunek et al. | 250/559.4 |

FOREIGN PATENT DOCUMENTS 4-177823  6/1992  Japan .

*Primary Examiner*—Frank Gonzalez
*Assistant Examiner*—Jason D. Eisenberg
*Attorney, Agent, or Firm*—Senniger, Powers, Leavitt & Roedel

[57] ABSTRACT

Apparatus and method for the inspection of the edges of multiple semiconductor wafers at the same time. The wafers are held in a cassette and a columnar beam of light is projected tangentially to an upper edge portion of the wafers. Visual detection of back scattering of light from the edge of any of the wafers reveals the edge defect. Rotation of the wafers using the apparatus permits the entire circumference of the wafers to be inspected. The apparatus holds the wafers in such a way as to protect their polished surfaces during the inspection process.

20 Claims, 3 Drawing Sheets

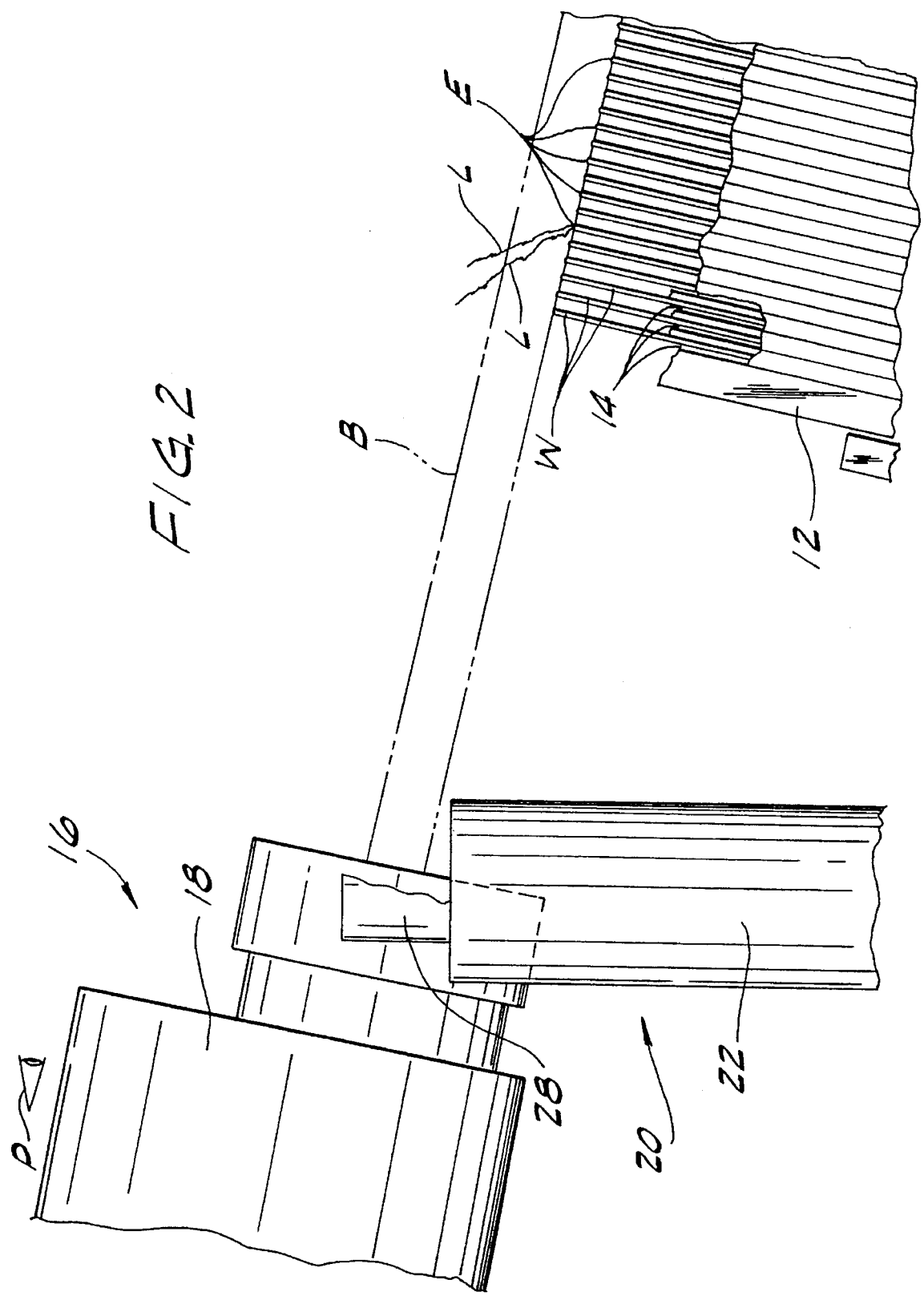

5,592,295

APPARATUS AND METHOD FOR SEMICONDUCTOR WAFER EDGE INSPECTION

SUMMARY OF THE INVENTION

This invention relates generally to the inspection of semiconductor wafers used to make computer chips and, more particularly, to a method of and apparatus for inspecting the edges of a plurality of such wafers in a single operation.

Defects and imperfections on the edge of a silicon wafer are detrimental to wafer performance and quality. Unfortunately, these defects cannot be detected by laser based imperfection detection systems. Heretofore, edge inspection has involved using a bright light to illuminate the edge of an individual wafer, rotating the wafer (held in a horizontal position on a chuck) under the light, and visually observing scattering or other distortion of the light indicative of a defect in the edge. This procedure has been carried out for each individual wafer, making inspection very time consuming and costly.

The present invention is directed to an improved method of and apparatus for carrying out the wafer edge inspection process. Among the several objects of this invention may be noted the provision of such an improved method of and apparatus for inspecting the edges of a plurality of wafers (e.g., up to 25) in a single operation; the provision of such apparatus which is capable of inspecting wafers of different diameters and which can be rapidly converted between a mode for inspecting wafers of one diameter and a mode for inspecting wafers of a different diameter; the provision of such apparatus which is economical to manufacture and easy to operate; the provision of such apparatus which protects the wafers during the inspection process; and the provision of such a method which also provides the advantages noted above.

Other objects and features of the present invention will be in part apparent and in part pointed out hereinafter.

BRIEF DESCRIPTION OF THE DRAWINGS

FIG. 2 is an enlarged fragmentary view of the apparatus of FIG. 1;

Corresponding reference characters indicate corresponding parts throughout the several views of the drawings.

DETAILED DESCRIPTION OF THE PREFERRED EMBODIMENT

Figure 1:
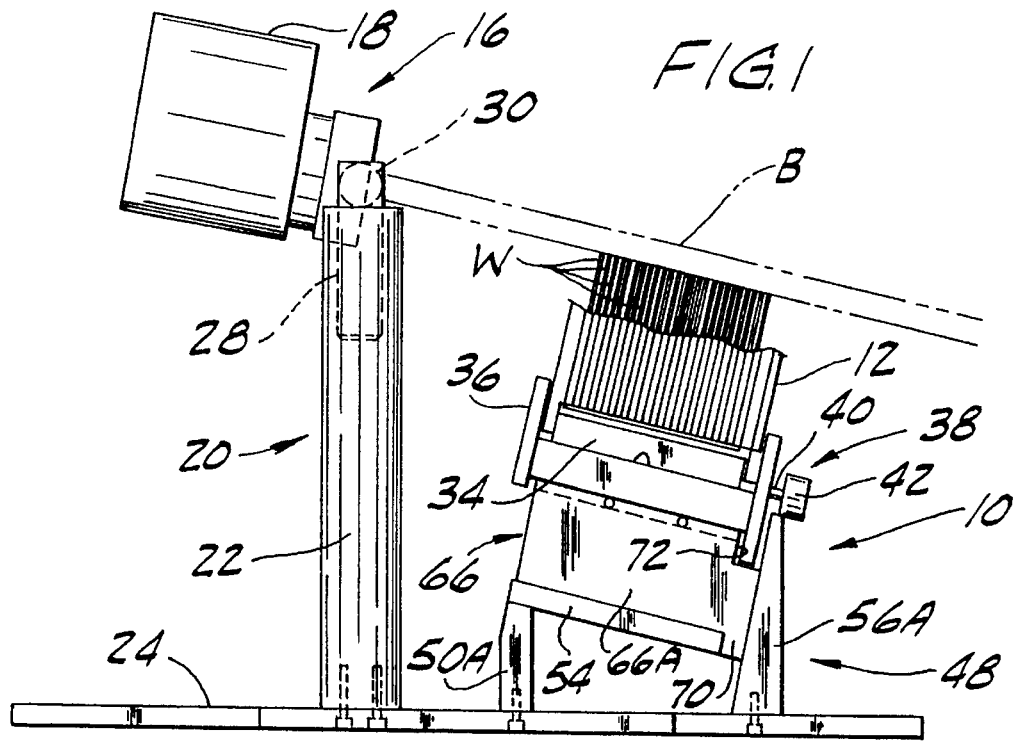
FIG. 1 is an elevation of wafer inspection apparatus of the present invention shown as used in inspecting wafers for edge defects.

Referring now to the drawings, and in particular to FIG. 1, apparatus for inspecting a plurality of semiconductor wafers is shown to include a support system, indicated generally at 10, supporting a wafer cassette 12 holding the semiconductor wafers W. The wafer cassette 12 is of conventional construction, having an open top, an open bottom and a series of partitions inside the cassette defining a plurality of parallel slots 14 (FIG. 2) for holding semiconductor wafers W of the same diameter. Each wafer slot 14 is adapted to hold a single wafer W extending from the slot above the open top of the cassette 12. The wafers W are held by the cassette 12 in spaced apart parallel relation, each wafer having a center and a generally circular outer edge E. In fact, the wafers W are formed so that the edges each have a short segment (not shown) which is straight for purposes of orienting the wafers. However, the wafers W are generally circular. The wafer cassette 12 holds the wafers W with their centers substantially on a common axis and their edges E substantially in alignment.

A light source, generally indicated at 16, is capable of projecting a well-defined columnar beam of light B (illustrated by parallel lines in FIGS. 1 and 2) along a central longitudinal axis generally parallel to the common axis of the wafers W and generally tangential to the edges E of the wafers in the cassette 12 to illuminate the edges. The light source 16 includes a housing 18 which is mounted by a stand (generally indicated at 20) at a predetermined height. A projection lamp (not shown) having a brightness of about 21,000 foot candles is located in the housing and provides the beam of light B. It has been found that a brightness of 18,000 foot candles produces satisfactory results. However, it is to be understood that the brightness of the light may be lower than 18,000 foot candles and still fall within the scope of the present invention. The stand 20 includes a post 22 mounted on and projecting up from a base plate 24 of the apparatus, and a pivoting mount including a vertical member 28 connected to the post and a horizontal member 30 extending from the vertical member to the housing 18. The horizontal member 30 is capable of pivoting about a horizontal axis relative to the vertical member 28 and post 22 to change the angle of the beam of light B so as to maintain the beam tangential to the upper portions of the edges E of the wafers W. The horizontal member 30 is capable of being fixed in a selected angular position by suitable locking devices, such as set screws (not shown).

The wafers W in the wafer cassette 12 engage a roller 34 and the wafer cassette rests on a frame 36 of a wafer rotating device (indicated generally at 38) supported by the support system 10. The wafer rotating device 38 is of a conventional construction, having an axle 40 mounting the roller 34 which extends outwardly from the frame 36 to a hand grip 42. Wafer rotating devices of the same type as wafer rotating device 38 are used for orienting the wafers W in the cassette so that the straight portion of the edge E is at the bottom. The roller 34 is located below the open bottom of the cassette 12 and its outer surface engages the edges E of the wafers in the cassette so that rotation of the roller causes the wafers W to rotate in an opposite direction within the wafer cassette. The wafer cassette 12 is made of a suitable low-friction material (e.g., Teflon® or polypropylene) to minimize wear on the wafers W as they rotate in their respective slots 14.

Figure 3:
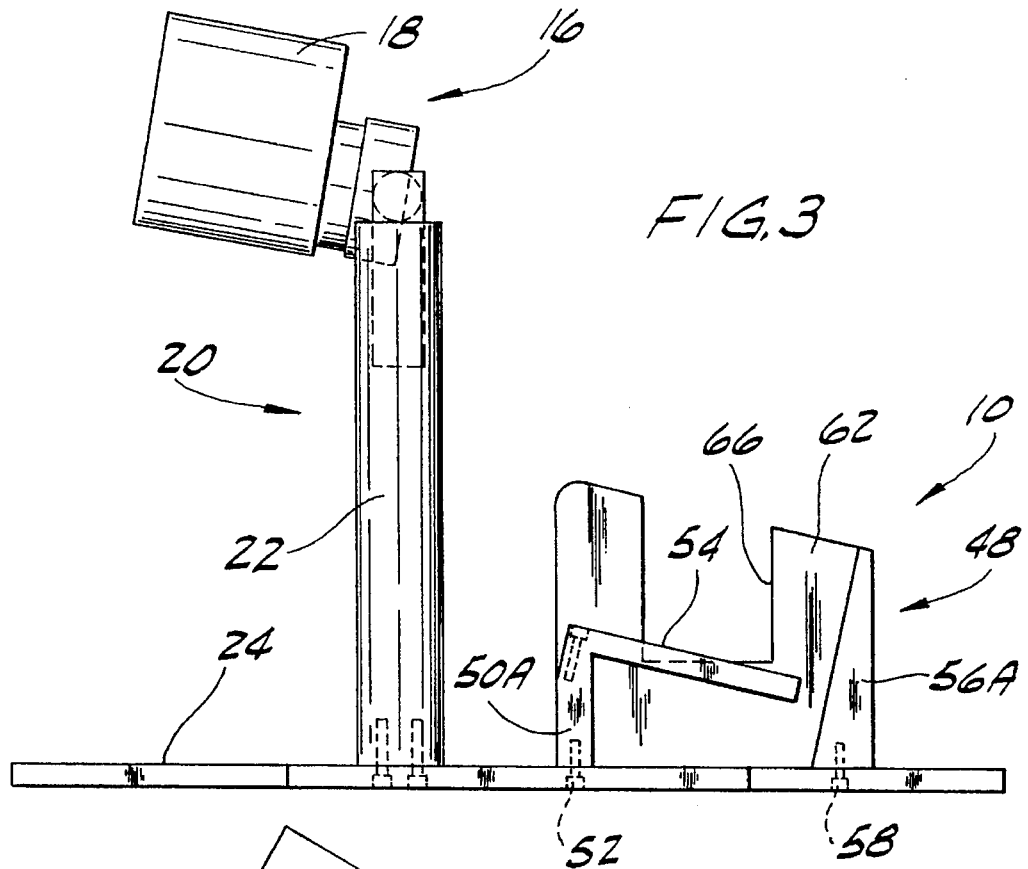
FIG. 3 is an elevation of the wafer inspection apparatus with the wafers, a wafer cassette, a wafer rotation device and a spacing member of the apparatus removed.
Figure 4:
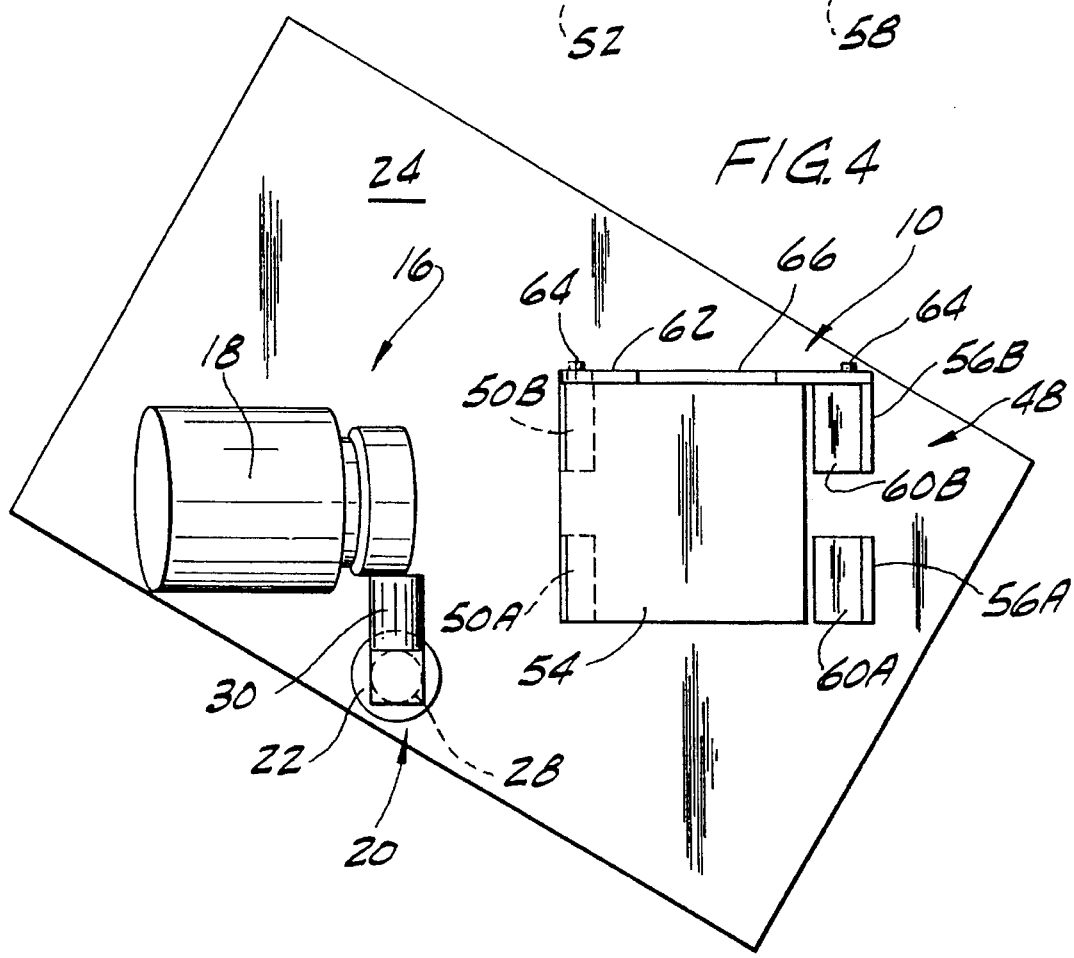
FIG. 4 is a top plan of the apparatus.

Referring now to FIGS. 3 and 4, the support system 10 comprises a platform, indicated generally at 48, including a pair of legs 50A, 50B fastened by bolts 52 to the base plate 24 and holding in cantilever fashion a support plate 54 extending rearwardly and at a downward angle from the legs. Spaced rearwardly from the rear edge of the support plate 54 are a pair of standoffs 56A, 56B connected to the base plate 24 by bolts 58. A forward facing surface 60A, 60B of each standoff 56A, 56B is sloped at an angle which is complementary to the angle the top surface of the support plate 54. An upstanding side plate 62 attached by bolts 64 to the leg 50B and the standoff 56B provides a guide surface against which the wafer cassette 12 may rest to be properly positioned. A slot 66 in the side plate 62 facilitates placing the wafer cassette 12, the wafer rotating device 38 and other elements of the support system 10 (described hereinafter) on the support plate 54.

Figure 5A:
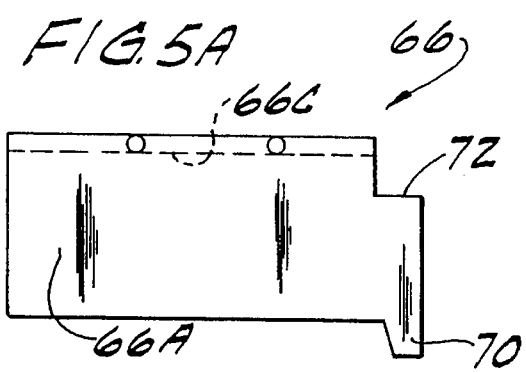
FIG. 5A is an elevation of a first spacing member of the apparatus.
Figure 6A:
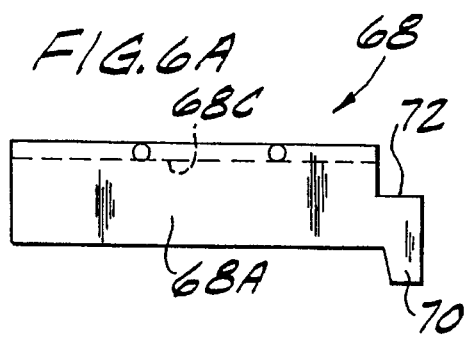
FIG. 6A is an elevation of a second spacing member of the apparatus.
Figure 5B:
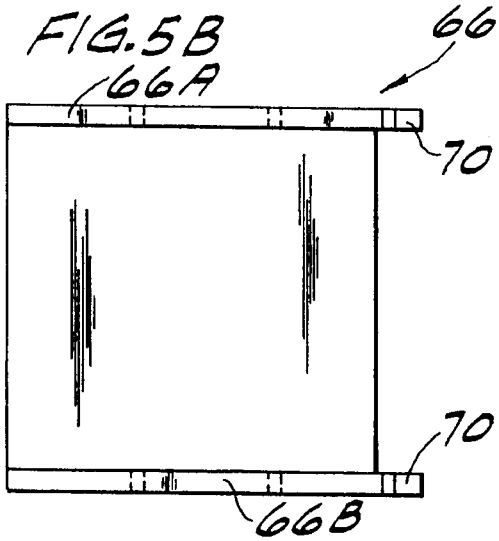
FIG. 5B is a bottom plan of the first spacing member.
Figure 6B:
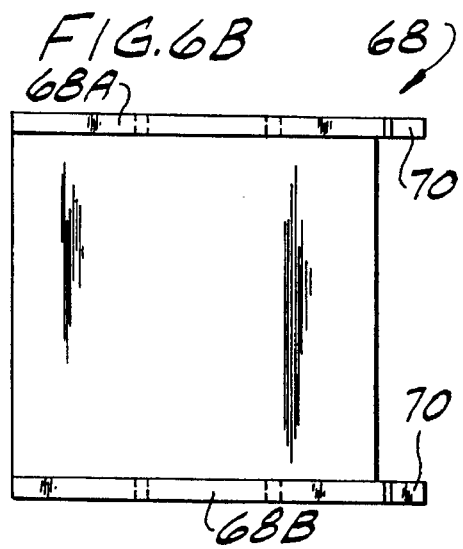
FIG. 6B is a bottom plan of the second spacing member.

In a preferred embodiment, the support system 10 further includes a riser generally indicated at 66 in FIGS. 5A and 5B, comprising a pair of laterally spaced side members 66A, 66B and a top member 66C extending between and connecting the side members. The support system 10 also includes a shorter riser, indicated generally at 68, which is shown in FIGS. 6A–6B to comprise a pair of laterally spaced side members 68A, 68B and a top member 68C extending between and connecting the side members. Use of the risers 66, 68 (broadly,"spacing members") permits the apparatus to be easily reconfigured in different modes for inspecting wafers of different diameters. In that regard, it may be seen that the difference between the riser 66 shown in FIGS. 5A and 5B and the riser 68 shown in FIGS. 6A and 6B is the height of their side members (66A, 66B and 68A, 68B).

The side members of the risers 66, 68 are each formed at their rearward ends with a downwardly projecting tail 70 which is snugly received between the rear edge of the support plate 54 and the forwardly facing surfaces 60A, 60B of the standoffs 56A, 56B. As may be seen in FIG. 1, engagement of the side members 66A, 66B with the standoffs 56A, 56B holds the riser 66 from sliding down the sloped support plate 54 on which it rests. Generally L-shaped notches 72 in the upper rear edges of the side members 66A, 66B, 68A, 68B may receive either a rear portion of the wafer rotating device frame 36 (FIG. 1) to permit the wafer rotating device 38 to be held in a flat position, parallel to the top member 66C, 68C of the risers 66, 68 and the support plate 54 of the platform 48, or a portion of the wafer cassette 12. It is to be understood that the support system 10 of the present invention may include additional risers (not shown) or no risers, and still fall within the scope of the present invention.

Inspection of the wafers W using the apparatus of the present invention begins by determining whether one or more risers 66, 68 will be needed to hold upper portions of the edges E of the wafers at a position which will be generally tangential to the beam of light B to be projected from the light source 16. The determination will depend upon the diameter of the wafers W to be inspected. Assuming it is determined that the riser 66 is needed, it is placed on the support plate 54 of the platform and the wafer rotating device 38 is stacked upon the riser. It is to be understood that for large diameter wafers, no riser would be used and the wafer rotating device 38 would rest directly on the support plate 54 of the platform.

The wafer cassette 12 will have been previously loaded with the polished surfaces all of the wafers W in the cassette facing in one direction and the unpolished surfaces facing in the other direction. The wafer cassette 12 is placed on the riser 66 so that the polished surfaces face toward the light source 16 and the unpolished surfaces face away from the light source. As supported on the wafer rotation device 38 and support system 10, the cassette 12 is tipped back so that the weight of the wafers W is largely supported by engagement of the unpolished surfaces of the wafers with the cassette in the slots 14. In this way, there is little opportunity for wear or other damage to the wafers W as they are rotated within the cassette 12. The portions of the edges E of the wafers located at the open bottom of the cassette 12 engage the roller 34 so that rotation of the roller by turning the hand grip 42 will cause the wafers W to rotate in an opposite direction.

The light source 16 is energized so that the light beam B is projected generally tangentially to the edges E of the wafers W above the cassette 12. To more precisely align the beam of light B in tangential relation to the upper portions of the edges E, the housing 18 of the light source may be pivoted relative to the vertical member 28 and post 22 by releasing and turning the horizontal member 30 of the stand 20. As shown in FIG. 2, inspection of the edges E of the wafers is made visually from a position P above and forward of the location where the beam of light B is emitted from the housing 18. It will be noted that portions of the vertical member 28 and horizontal member 30 have been broken away in FIG. 2 to show the beam B continuously from the housing 18 to the wafers W. By turning the hand grip 42, the inspector brings new portions of the edges E of the wafers into tangential relationship with the beam of light B. In this way, the inspector may inspect the entire circumference of all of the wafers W from a single vantage point with a simple manipulation of the apparatus.

The edges E of the wafers W which do not have a defect produce a diffused back scattering of the light in the beam B readily recognized by skilled inspectors. However, the presence of a defect in an edge E of one of the wafers W will cause a back scattering of light which can be observed by the inspector at position P as a point of light on the wafer edge. The back scattering of light from the beam B caused by a defect is diagrammatically illustrated by lines L in FIG. 2. The inspector may then remove the defective wafer or mark the wafer as having an edge defect. It has been found to be practical to inspect 25 wafers at a time for edge defects using the apparatus and method of the present invention. The limitation of 25 wafers arises only because the largest industry standard wafer carrier is sized to hold 25 wafers.

Thus, it may be seen that the several objects and features of the present invention are achieved. Edge inspection of wafers W can be carried out rapidly because multiple wafers can be inspected at a single time by an inspector using the columnar beam of light from the light source 16 directed tangentially to upper portions of the edges of the wafers. The wafers W are held by the apparatus so that their weight is supported primarily on their unpolished surfaces, thereby protecting the polished surfaces. Moreover, the apparatus includes risers 66, 68 which make the apparatus capable of quick reconfiguration for inspecting wafers of different diameters.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for inspecting a plurality of semiconductor wafers at substantially the same time, said apparatus comprising a holder for holding a plurality of wafers of substantially identical diameter in spaced apart parallel relation, each wafer having a center and a generally circular outer edge, said holder being adapted to hold the wafers with their centers substantially on a common axis, a light source for projecting a well-defined columnar beam of light along a central longitudinal axis generally parallel to said common axis of the wafers and generally tangential to the edges of the wafers in the holder, and a device for rotating the wafers while the beam is projected on the edges of the wafers to detect any imperfections in the edges of the wafers.

2. Apparatus as set forth in claim 1 further comprising a housing for said light source, a stand for mounting the housing at a predetermined height, and means for adjusting the angular position of the housing relative to the stand to change the direction of the light beam projected by the light source.

3. Apparatus as set forth in claim 2 wherein said housing is mounted on the stand for pivotal movement about a generally horizontal axis.

4. Apparatus as set forth in claim 2 further comprising a support system for supporting said holder so that the upper edges of the wafers held by the holder are generally tangential no said light beam projected by the light source.

5. Apparatus as set forth in claim 4 wherein said light source is at a fixed height, said support system comprising a support and one or more devices cooperable with the support for supporting said holder at one or more different elevations to accommodate wafers of different diameters.

6. Apparatus as set forth in claim 5 wherein each of said one or more devices is cooperable with the support comprises a spacing member adapted to be placed on the support below the holder.

7. Apparatus as see forth in claim 6 wherein said spacing member has a positioning member engageable with the support for holding the spacing member in proper position relative to the support.

8. Apparatus as set forth in claim 5 wherein said support comprises a platform inclined at an angle suitable for supporting the holder at an angle relative to the horizontal.

9. Apparatus as set forth in claim 1 wherein said holder comprises cassette having an open top, an open bottom and a series of partitions inside the cassette defining a plurality of parallel slots, each slot being adapted to hold a single wafer with the wafer extending from the slot above the open top of the cassette.

10. Apparatus as set forth in claim 9 wherein said device for rotating the wafers comprises a roller mounted below the open bottom of the cassette for rotation on an axis generally parallel to said common axis, said roller having an outer surface adapted for engagement with the edges of the wafers, and a mechanism for rotating the roller while the outer surface of the roller is in engagement with the wafers thereby to rotate the wafers about said common axis.

11. Apparatus as set forth in claim 10 wherein said cassette is fabricated from a low-friction material for minimizing wear on the wafers as they rotate in their respective slots.

12. Apparatus as set forth in claim 10 further comprising a support system for supporting said cassette and said device for rotating the wafers, said support system comprising a support and one or more devices cooperable with the support for supporting the holder at one or more different elevations to accommodate wafers of different diameters.

13. Apparatus as set forth in claim 12 wherein each of said one or more devices cooperable with the support comprises a spacing member adapted to be placed on the support below the holder and said device for rotating the wafers.

14. Apparatus as set forth in claim 13 wherein said spacing member has a positioning member engageable with the support for holding the spacing member in proper position relative to the support.

15. Apparatus as set forth in claim 12 wherein said support comprises a platform inclined at an angle suitable for supporting the holder at an angle relative to the horizontal.

16. A method of inspecting a plurality of semiconductor wafers at substantially the same time, each wafer having a center and a generally circular outer edge, said method comprising the following steps:

holding a plurality of generally round semiconductor wafers of substantially identical diameter so that the wafers are spaced apart and generally parallel with respect to one another with the centers of the wafers substantially on a common axis, projecting a well-defined columnar beam of light along a central longitudinal axis generally parallel to said common axis of the wafers and generally tangential to the edges of said plurality of wafers thereby to illuminate the edges, rotating the wafers while the beam is projected on the edges of the wafers, and detecting any imperfections in the edges of the wafers as the wafers rotate.

17. A method as set forth in claim 16 wherein said detecting step is carried out by visual observation.

18. A method as set forth in claim 17 wherein said visual observation is from a location above and near the light source, and wherein said visual observation involves observing back scattering of the beam of light for indications of imperfections in a wafer.

19. A method as set forth in claim 16 further comprising holding the beam of light at a fixed height and holding wafers at a variable height depending on the diameter of the wafers.

20. A method as set forth in claim 19 further comprising holding the wafers so that the common axis of the wafers is at a fixed angle, and adjusting the angle of the light beam so that it is parallel to said fixed angle.

* * * * *